United States Patent [19]

Abe et al.

[11] Patent Number: 5,200,388

[45] Date of Patent: Apr. 6, 1993

[54] METALORGANIC CHEMICAL VAPOR DEPOSITION OF SUPERCONDUCTING FILMS

[75] Inventors: Hitoshi Abe; Tomohiro Nakamori, both of Tokyo, Japan

[73] Assignee: Oki Electric Industry Co., Ltd., Tokyo, Japan

[21] Appl. No.: 542,151

[22] Filed: Jun. 22, 1990

Related U.S. Application Data

[63] Continuation-in-part of Ser. No. 348,676, May 5, 1989, abandoned.

[30] Foreign Application Priority Data

May 13, 1988 [JP] Japan .................... 63-114710

[51] Int. Cl.$^5$ .................... B05D 3/06; B05D 5/12; C23C 16/00
[52] U.S. Cl. .................... 505/1; 505/734; 505/730; 427/62; 427/255.3; 427/255.2; 427/255.1; 427/314; 427/533; 427/558; 427/585
[58] Field of Search .................... 505/1, 734, 730; 427/62, 63, 314, 255.3, 126.3, 255.2, 255.1, 53.1, 54.1, 45.1

[56] References Cited

U.S. PATENT DOCUMENTS

| | | | |
|---|---|---|---|
| 4,501,602 | 2/1985 | Miller et al. | 427/255 |
| 4,626,449 | 12/1986 | Hirai et al. | 427/54.1 |
| 4,751,149 | 6/1988 | Vijayakumar et al. | 427/255.3 |
| 4,812,325 | 3/1989 | Ishihara et al. | 427/255.3 |

FOREIGN PATENT DOCUMENTS 61-141420 6/1986 Japan .
WO89/03594 10/1987 PCT Int'l Appl. .

OTHER PUBLICATIONS

Berry et al "Formation of high Tc superconducting films by organometallic chemical vapor deposition" MRS (Reno, Nev.) Apr. 1988, pp. 141-143.
Berg et al, "Fractional Sublimation of various metal chelates of dipvaloylmethane", Anal. Chem. Acta, 60 (Jan. 1972) pp. 117-125.
D. Dijkkamp and T. Venkatesan, "Preparation of Y-Ba-Cu oxide Superconductor thin films using pulsed laser evaporation from high Tc bulk material." Appl. Phys. Lett. 51 (b), Aug. 24, 1987, pp. 619-621.

Primary Examiner—Shrive Beck
Assistant Examiner—Roy V. King
Attorney, Agent, or Firm—Edward D. Manzo; Andrew G. Kolomayets

[57] ABSTRACT

An oxide superconducting film is formed by CVD. The starting material gas sources are $Ba(DPM)_2$, $Ba(DPM)_2 \cdot (THF)_n$ or $Ba(DPM)_2 \cdot (DMF)_n$; $Cu(DPM)_2$, $Cu(DPM)_2 \cdot (THF)_n$ or $Cu(DPM)_2 \cdot (DMF)_n$; and $M(DPM)_3$, $M(DPM)_3 \cdot (THF)_n$ or $M(DPM)_3 \cdot (DMF)_n$, where DPM is 2,2,6,6-tetramethyl-3,5-heptaneodianate represented by the chemical formula:

$$CH_3C(CH_3)_2COCHCOC(CH_3)_2CH_3$$

THF is tetrahydrofuran represented by the chemical formula:

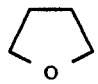

DMF is dimethylformamide represented by the chemical formula:

$$HCON(CH_3)_2$$

M is an element chosen from the list:
Y, La, Nd, Pm, Sm, Eu, Er, Gd, Tb, Dy, Ho, Tm, Yb and Lu,
and n is any integer. The starting gas sources are introduced into a growth tank after gasification together with at least one of the gases $O_2$, $O_3$, or $N_2O$, and the oxide film being formed on a substrate placed in said growth tank.

5 Claims, 9 Drawing Sheets

FIG.2A CVD FILM
500Å
FIG.2B SPUTTER FILM
500Å

METALORGANIC CHEMICAL VAPOR DEPOSITION OF SUPERCONDUCTING FILMS

BACKGROUND OF THE INVENTION

This is a continuation-in-part of U.S. Ser. No. 07/348,676 filed May 5, 1989 now abandoned.

This invention concerns a process for forming oxide superconducting films (thin films), and in particular, a suitable process for forming oxide superconducting films with any desired composition and crystalline structure.

In comparison to prior art superconductors made from materials containing Nb (nyobium), much research has been carried out recently on oxide superconductors (known as ceramic conductors) which show superconductivity at higher temperatures. The reason for this is that if superconductivity is possible at higher temperatures, the cooling system required can be simplified, the advantages of superconductivity can easily be applied to a variety of fields, and great contributions can be made to the growth of industry. To give an example, it has been found that bulk ceramic superconductors containing sintered materials of the Y-Ba-Cu-0 type show superconductivity at temperatures above that of liquid nitrogen.

If however it is desired to use oxide superconductors containing Y-Ba-Cu-O type substances in microelectronics, e.g. Josephson elements, transistors or circuit wiring, it is necessary to prepare thin films of them, and to date the only method reported for doing this was the sputter method.

The sputter method however suffered from the disadvantage that when the generation of the film is repeated, the composition of the target varies, and the composition of the thin film formed diverges widely from the composition ratio of the target.

These problems are not conducive to obtaining oxide superconductor films with a complex and precise composition ratio.

Further, if such films are to be used in, e.g. Josephson elements, the film thickness has to be controlled at the molecular layer level, but this control is extremely difficult to realize with the sputter method.

Further, it is desirable that the surface of the film formed is flat down to the molecular level, but with the sputter method the desired degree of flatness is difficult to achieve.

Due to the above reasons, it was not possible using prior-art methods to obtain a high quality superconductor film of desired composition and thickness, and excellent flatness.

SUMMARY OF THE INVENTION

An object of the invention is to eliminate the above problems.

Another object of the invention is to provide a process for forming an oxide superconducting film of excellent quality.

In order to achieve this objective, this invention uses CVD (Chemical Vapor Deposition) to form the oxide superconducting film. Certain starting materials are chosen from at least one of the compounds $Ba(DPM)_2$, $Ba(DPM)_2 \cdot (THF)_n$ or $Ba(DPM)_2 \cdot (DMF)_n$, at least one of the compounds $Cu(DPM)_2$, $Cu(DPM)_2 \cdot (THF)_n$ or $Cu(DPM)_2 \cdot (DMF)_n$, and at least one of the compounds $M(DPM)_3$, $M(DPM)_3 \cdot (THF)_n$ or $M(DPM)_3 \cdot (DMF)_n$, where:

DPM is 2,2,6,6-tetramethyl-3,5-heptaneodianate represented by the chemical formula:

$CH_3C(CH_3)_2COCHCOC(CH_3)_2CH_3$

THF is tetrahydrofuran represented by the chemical formula:

DMF is dimethylformamide represented by the chemical formula:

$HCON(CH_3)_2$

M is an element chosen from the list:
Y, La, Nd, Pm, Sm, Eu, Er, Gd, Tb, Dy, Ho, Tm, Yb or Lu, and n is any integer.

The starting materials are gasified, and gases are introduced into a growth tank into which a substrate has been placed. Along with these first gases, second gases are also introduced to the growth tank, including at least one of the gases $O_2$, $O_3$, or $N_2O$. A superconducting oxide film is thereby formed on the substrate in said growth tank.

In the above method, it is convenient if the substrate upon which said superconductor film is grown, is preheated.

Further, in the above CVD method, it is convenient if the starting material gases supplied to the growth tank are irradiated with light, if the radiant light consists of 2 or more lights with different wavelengths, and if the irradiation of the respective starting material gases is made with different lights.

It is also convenient if part or all of the $O_2$ gas in the above starting material gases is ozonized.

It is moreover convenient if the growth of the superconductor film in said CVD method is carried out under conditions that permit it to form one molecular layer at a time.

In this construction, the CVD method is used which depends on chemical reactions. Compared to the sputter method, therefore, there is far less damage to the base layer or substrate surface in which the superconducting film is formed, or to the surface of the insulating layer which constitutes the weak coupling of a Josephson element. As a result, the surface of the thin film after it has finished growing is extremely flat.

By suitably choosing the starting material gases, varying the conditions or order of gas supply, and varying the film growth conditions, it is possible to form a superconducting film with any desired composition and crystalline structure.

Further, by irradiating the starting material gases or by using ozonized oxygen, the starting material gases are excited, and the desired superconducting film can be obtained even when the temperature of the growth tank is low. It is thus possible to form a superconducting film at a temperature below the limit temperature of the heat resistance of microelectronic devices.

It is moreover possible, when growing superconductor films by the CVD method, that the thin film grows at the rate of one molecular layer at a time. It is thus easy to grow the film to suit the coherence length of a superconductor.

BRIEF DESCRIPTION OF THE DRAWINGS

FIG. 2A and FIG. 2B are diagrams showing the surface conditions of the superconducting films formed by the method of the invention and formed by the prior-art sputter method.

DETAILED DESCRIPTION OF THE EMBODIMENTS

Hereinafter, the method of forming thin oxide superconducting films by this invention will be described with reference to the drawings.

In the following embodiments, the formation of the oxide film is described in the case of the Y-Ba-Cu-O system. The method of this invention is however not limited to this example, and may be applied to oxide superconductors of other compositions by varying the starting material gases and growth conditions.

Further, the drawings used in the description give only as much detail as is necessary to explain the invention. It should therefore be understood that the configurations and spatial relationship of each structural component are not limited to those in the diagram. Also, similar components are denoted by identical numbers.

Embodiment 1

Figure 1:
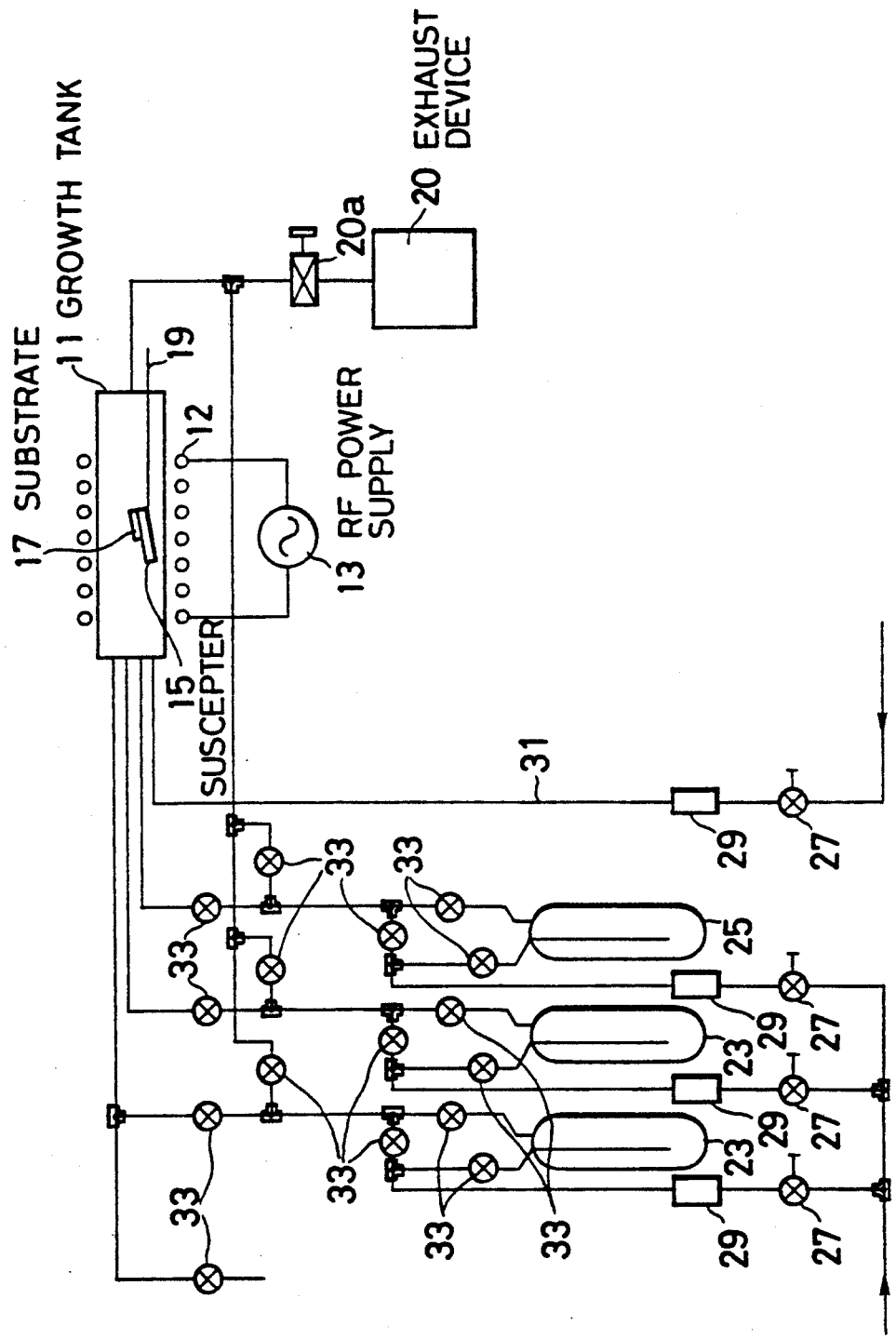
FIG. 1 is a diagram for explaining the first to third embodiments of the process for forming an oxide superconducting material film according to the invention.

The method of forming the superconducting film in Embodiment 1 of this invention will now be described. FIG. 1 is a block diagram of a suitable CVD apparatus for forming the film with reference to FIG. 1.

In FIG. 1, 11 is a growth tank (sometimes referred to as a reaction tube) which may be made of, for example, quartz. An induction coil 12 made of, for example, copper pipe, is wound around the tank, and is connected to a high frequency (RF) power supply 13. 15 is a susceptor made of, for example, an alloy such as Monel (Ni-Cu), to which a substrate 17 is previously attached. The material of substrate 17 depends on the type of oxide superconductor which it is desired to form, but may be $MgO$, $SrTiO_3$, $M_xWO_3$ (where $M_x$=Li, Na or K), zirconia, or sapphire. When forming the oxide superconducting film, substrate 17 is heated to the desired temperature by high frequency induction heating with induction coil 12 and high frequency power supply 13.

19 is a thermocouple in contact with substrate 17 for monitoring its temperature, the high frequency induction heating being controlled such that this temperature reaches the desired temperature.

20 is a vacuum exhaust device which may have a similar structure to that in the prior art, and which is used to exhaust the growth tank to a suitable degree of vacuum. This exhaust device 20 is provided with a regulator to adjust the conductance along the exhaust route, and the conductance may be varied freely.

21 is a first cylinder, 23 is a second cylinder and 25 is a third cylinder. These cylinders 21, 23 and 25 are all connected to the growth tank 11 through respective ducts. From each of the cylinders 21, 23 and 25 in this embodiment, a carrier gas is supplied via needle valves 27 and flowmeters 29. An oxygen supply duct 31 with needle valve 27 and flowmeter 29 is also connected to growth tank 11 so as to supply a specified quantity of oxygen to the tank.

The starting materials for forming the oxide superconducting film in this construction are stored in cylinders—a suitable Y (yttrium) compound, e.g. $Y(DPM)_3$, in cylinder 21, Ba (barium) compound, e.g. $Ba(DPM)_2$, in cylinder 23, and Cu (copper) compounds, e.g. $Cu(DPM)_2$, in cylinder 25. DPM is 2,2,6,6-tetramethyl-3,5-heptaneodianate represented by the chemical formula:

$$CH_3C(CH_3)_2COCHCOC(CH_3)_2CH_3$$

These chemical compounds are solids at ordinary temperature, and are converted to gases by heating. The cylinders are therefore heated inside to adjust the vapor pressure of these gases to suitable values—cylinder 21 to 130°-200° C., cylinder 23 to 230°-320° C., and cylinder 25 to 130° C. Inert gases such as He, Ne, Ar, Kr, Xe and $N_2$ are also supplied as carrier gases to cylinders 21, 23 and 25, bubbled through respective cylinders, and delivered from the cylinders to growth tank 11 as starting material gases containing the corresponding element (Y, Ba or Cu).

The flowrate of each starting material gas is adjusted to the specified value by means of the needle valves 27 and flowmeters 29 attached to respective cylinders, and the delivery time of each gas is also adjusted so as to control the composition ratio of the oxide superconducting film. Oxygen may be supplied to the growth tank at a fixed rate, or may be supplied together with the starting material gases. The amount of oxygen in the film may be varied by adjusting the oxygen flowrate, adjusting the oxygen supply time, or by varying the pressure in growth tank 11 by adjusting regulator 20a of exhaust device 20.

Further, by manipulating various combinations of the valves 33 shown in FIG. 1, the order in which starting material gases are supplied to tank 11 can be varied freely, and hence a film of desired composition and structure can easily be grown.

A specific example of the process followed for forming the oxide superconducting film in this embodiment will now be described.

Firstly, cylinders 21, 23 and 25 were charged respectively with starting materials $Y(DPM)_3$, $Ba(DPM)_2$ and $Cu(DPM)_2$, and the internal temperatures of the cylinders were maintained near 180° C., 300° C. and 170° C. respectively to convert said starting materials to gases. The flowrate of carrier gas (Ar) to each cylinder 21, 23 or 25 was set to 200 cc/min. and the flowrate of $O_2$ gas was set to 200 cc/min.

Using MgO as substrate 17, the growth surface of the oxide superconducting film was taken to be of the (100) orientation. The temperature of substrate 17, i.e. the growth temperature, was adjusted to approximately 600° C., the gases from cylinders 21, 23 and 25 together with $O_2$ gas were supplied to growth tank 11, and the film on substrate 17 was grown for approximately 30 min. When the film grown was examined with a secondary electron reflecting electron microscope (SEM), the film thickness was found to be approximately 5 μm. After growth, the substrate temperature was adjusted to 900°–950° C., and $O_2$ gas was passed through continuously for several hours. After this heat treatment, the temperature was gradually lowered to room temperature, and substrate 17 was removed. The surface of the film on the substrate was then examined with a profilometer and found to be very flat and smooth as shown in FIG. 2A. By contrast, the surface of a film prepared by the continuous sputter method was found to have considerable irregularities as shown in FIG. 2B.

Figure 3:
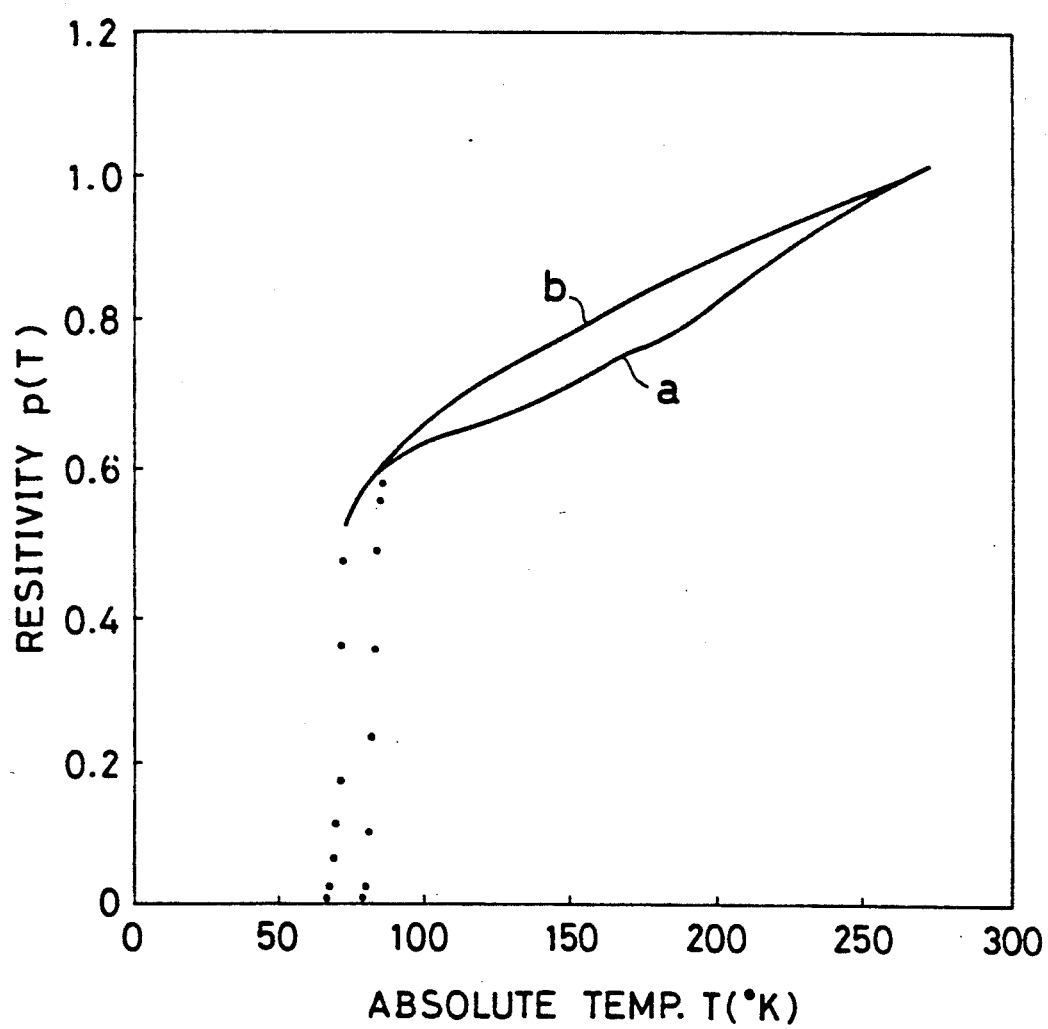
FIG. 3 is a diagram showing the resistance-temperature characteristics of the superconducting films formed by the process of the invention.

Curve (a) in FIG. 3 shows the resistance-temperature characteristics of the oxide superconducting film obtained in this embodiment. As seen from this curve (a), the resistance of the film decreases with decreasing temperature and finally reaches zero in the region of 65° K.

Embodiment 2

The CVD apparatus used in this embodiment is the same as that used in Embodiment 1.

In this embodiment, the starting materials were the gas sources used in Embodiment 1, i.e. $Y(DPM)_3$, $Ba(DPM)_2$ and $Cu(DPM)_2$ with the addition of the organic solvent tetrahydrofuran (abbreviated as THF) represented by the chemical formula:

Firstly, the cylinders 21, 23 and 25 were charged with starting materials $Y(DPM)_3 \cdot (THF)_n$, $Ba(DPM)_2 \cdot (THF)_n$ and $Cu(DPM)_2 \cdot (THF)_n$ respectively, and their internal temperatures were maintained near 160° C., 280° C. and 150° C. to convert the starting materials to gases. The flowrate of carrier gas (Ar) in cylinders 21, 23 and 25 was set at 200 cc/min, 300 cc/min and 200 cc/min respectively, and the flowrate of $O_2$ gas was set at 200 cc/min. n is any integer, and need not be greater than 10.

The gases from the cylinders 21, 23 and 25, together with $O_2$ gas, were introduced into growth tank 11, and a superconducting film was grown on the (100) surface of a substrate 17 consisting of MgO at a temperature (substrate temperature) of 600° C. for 30 min. The other growth conditions were the same as those of Embodiment 1. The film thus grown was very flat and smooth, similarly to the film in Embodiment 1. Its resistance—temperature characteristics are shown by curve (b) in FIG. 3 and its resistance became zero in the region of 80° K.

Embodiment 3

In place of the organic solvent tetrahydrofuran (THF), dimethylformamide (abbreviated as DMF), represented by the chemical structure $HCON(CH_3)_2$ was used to obtain starting materials $Y(DPM)_3 \cdot (DMF)_n$, $Ba(DPM)_2 \cdot (DMF)_n$ and $Cu(DPM)_2 \cdot (DMF)_n$. A film with good properties was obtained under very similar growth conditions to those in which THF was used. The subscript "n" is any integer, and need not be greater than 10.

In addition, the materials used in Embodiments 1, 2 and 3 above can be mixed. That is, one can use any combination of one or more of the substances $Y(DPM)_3$, $Y(DPM)_3 \cdot (THF)_n$ and $Y(DPM)_3 \cdot (DMF)_n$ as the Y starting material; one or more of the substances $Ba(DPM)_2$, $Ba(DPM)_2 \cdot (THF)_n$ and $Ba(DPM)_2 \cdot (DMF)_n$ as the Ba starting material; and one or more of the substances $Cu(DPM)_2$, $Cu(DPM)_2 \cdot (THF)_n$ and $Cu(DPM)_2 \cdot (DMF)_n$ as the Cu starting material. In these cases, it is still possible to form an oxide superconducting film with good properties.

Embodiment 4

Figure 4:
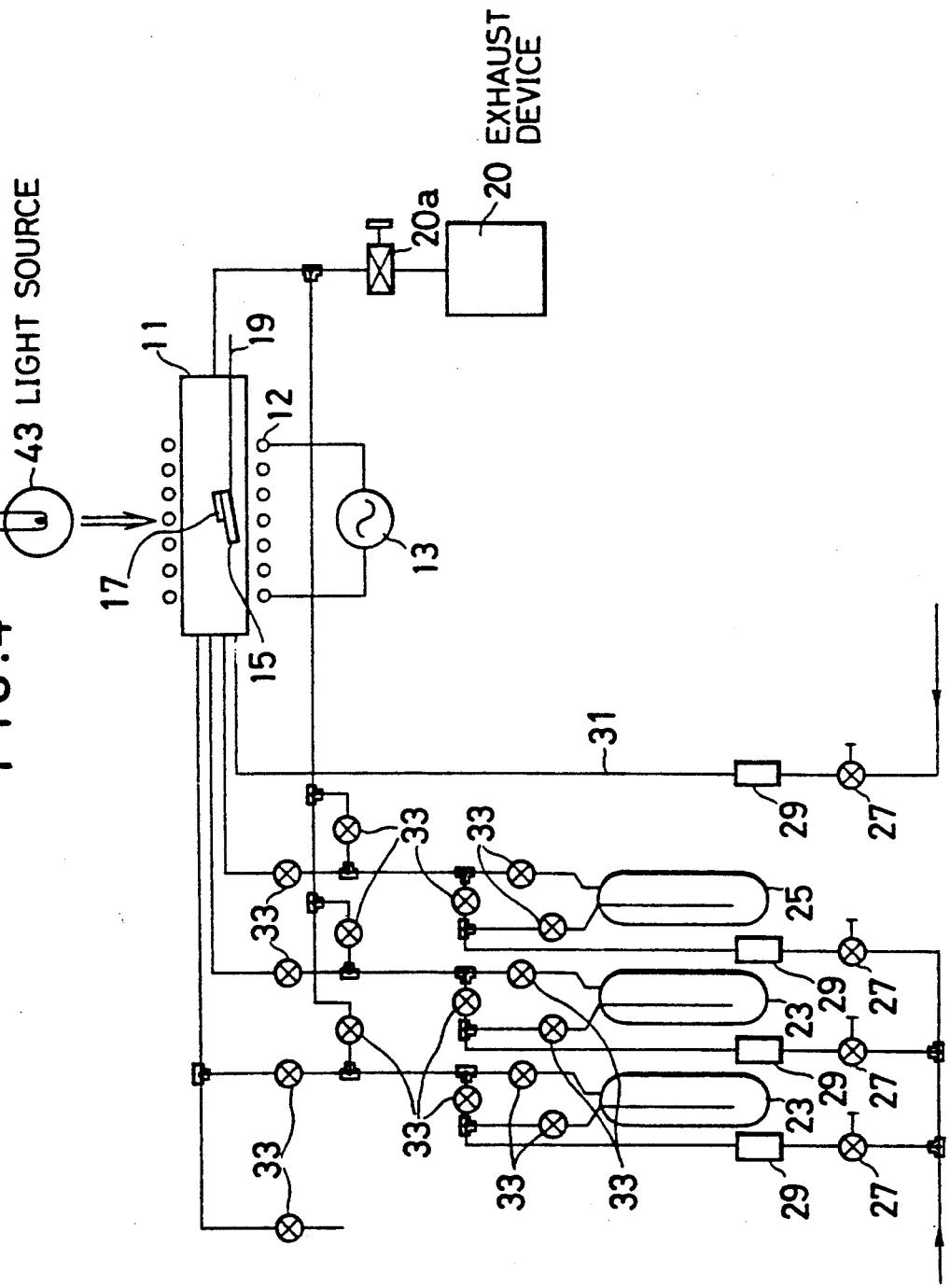
FIG. 4 is a diagram for explaining the fourth embodiment of the process of forming an oxide superconducting film according to the invention.

Embodiment 4 of forming an oxide superconducting film in this invention will now be described with reference to FIG. 4. FIG. 4 is a block diagram of the structure of a suitable CVD apparatus for forming the film in this embodiment.

In this method, light is made to irradiate the upper side of the substrate in growth tank 11, thereby optically exciting the starting material gases and the substrate surface. Apart from this optical excitation, the remaining details of the method are the same as those of Embodiment 1 and Embodiment 3, and their description will therefore be omitted.

In FIG. 4, an optical source 43 is installed outside growth tank 11 facing substrate 17. This optical source may be a lamp such as a mercury or xenon lamp, or a laser such as an eximer or argon laser. This optical source need not be limited to a single wavelength, but may contain lights of different wavelengths, and it may also be so designed that it can emit these different wavelengths separately. If an optical source capable of emitting different wavelengths is used, the starting material gas can be irradiated with a wavelength that easily excites the gas and the gas molecules adsorbed onto the substrate surface, and the chemical reaction is thereby promoted.

In the method of Embodiment 4, the oxide superconducting film is formed in the same way as in Embodiments 1–3. Since the chemical reaction is promoted due to excitation of the starting material gas and the gas molecules adsorbed by the substrate surface, however, the film can be grown when the electric furnace temperature, i.e. the temperature inside the growth tank, is lower than in the case where there is no optical irradiation, and damage to the substrate and film is thereby less.

Embodiment 5

Figure 5:
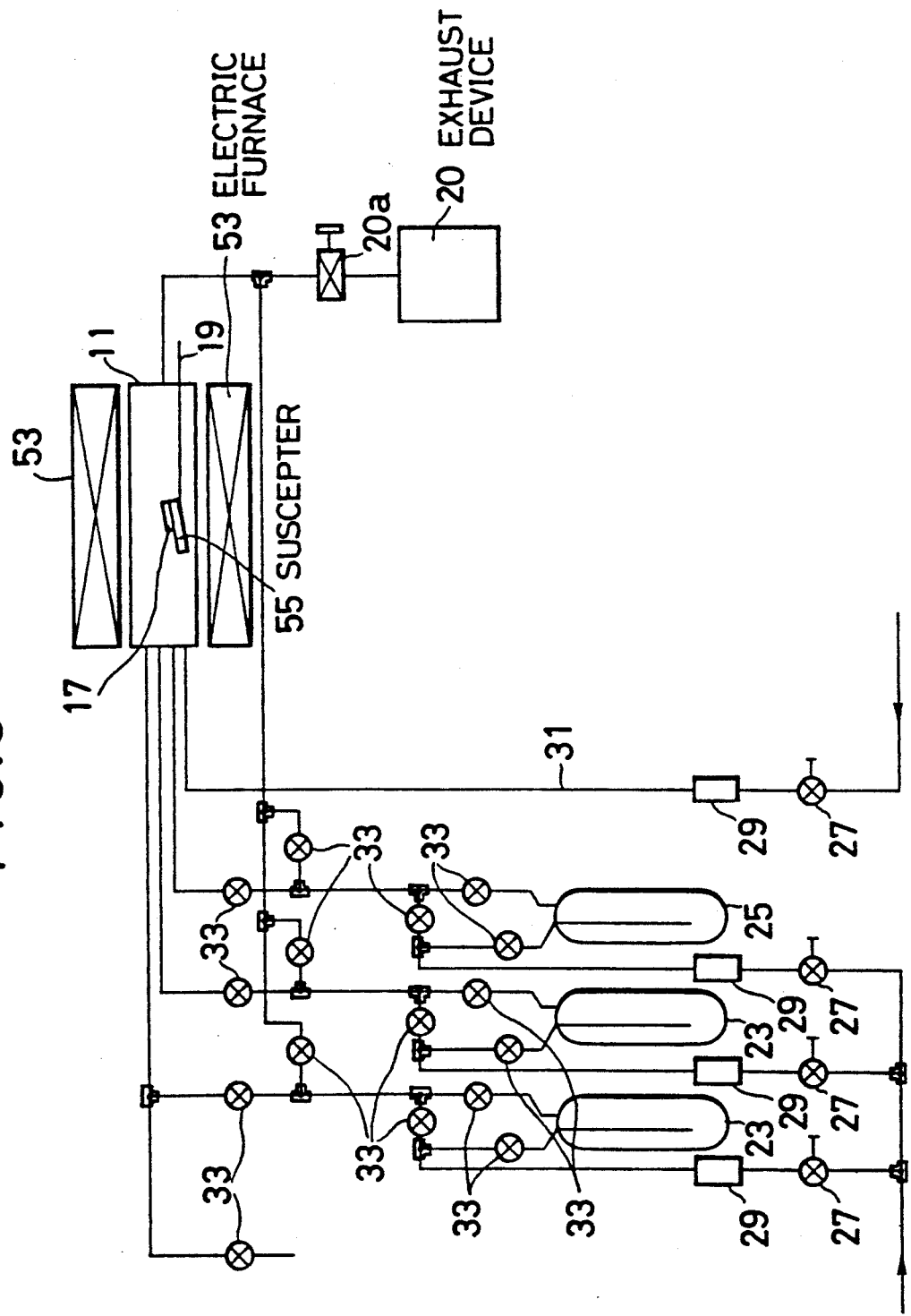
FIG. 5 is a diagram for explaining the fifth embodiment of the process of forming an oxide superconducting film according to the invention.

The Embodiment 5 of forming an oxide superconducting film in this invention will now be described with reference to FIG. 5. FIG. 5 is a block diagram of the structure of a suitable CVD apparatus for forming the film in this embodiment.

In Embodiment 5, growth tank 11 is covered with an electric furnace 53 so that the atmosphere inside can be raised to a high temperature. It is also desirable that susceptor 55 upon which substrate 17 is mounted can also be heated so as to heat the substrate, for example by means of a resistance heater.

In this embodiment, the heating of substrate 17 is carried out by an electric furnace 53 and the susceptor 55 consisting of a resistance heater. The other details are the same as in Embodiments 1-3, and will therefore be omitted.

Embodiment 6

Figure 6:
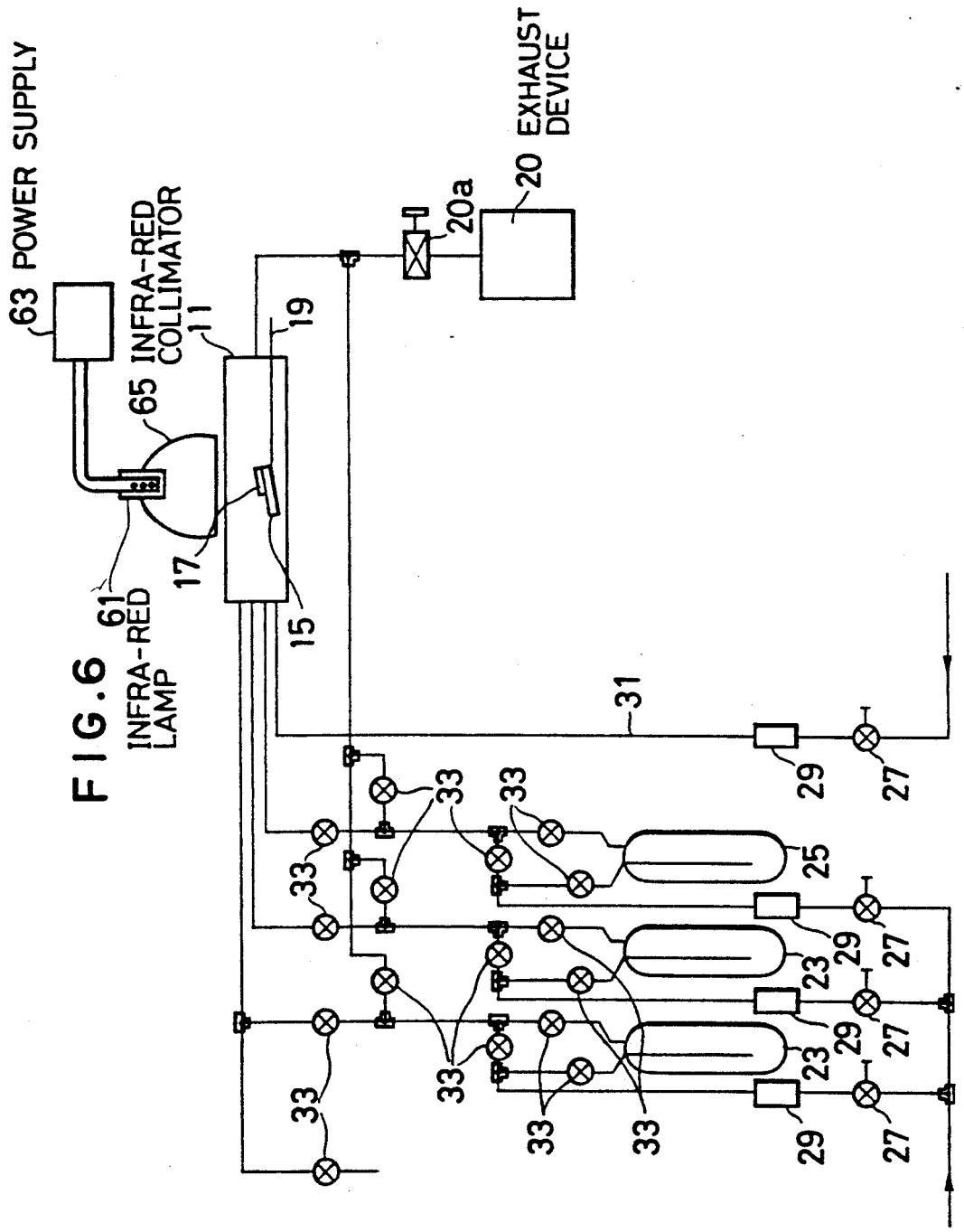
FIG. 6 is a diagram for explaining the sixth embodiment of the process of forming an oxide superconducting film according to the invention.

Embodiment 6 of forming an oxide superconducting film in this invention will now be described with reference to FIG. 6. FIG. 6 is a block diagram of the structure of a suitable CVD apparatus for forming the film in this embodiment.

In Embodiment 6, substrate 17 is heated by infra-red radiation. Apart from the use of infra-red heating, the other details of the method and the construction of the apparatus are the same as Embodiments 1-3, and will be omitted.

In FIG. 6, 61 is an infra-red lamp, 63 is a power supply for driving the infra-red lamp, and 65 is a condenser for infra-red radiation. Infra-red radiation is condensed by condenser 65 on substrate 17, and substrate 17, is thereby heated. The temperature of substrate 17 is monitored by a thermocouple 19, and the drive power supply 63 is controlled by the signal output from the thermocouple.

Embodiment 7

Figure 7:
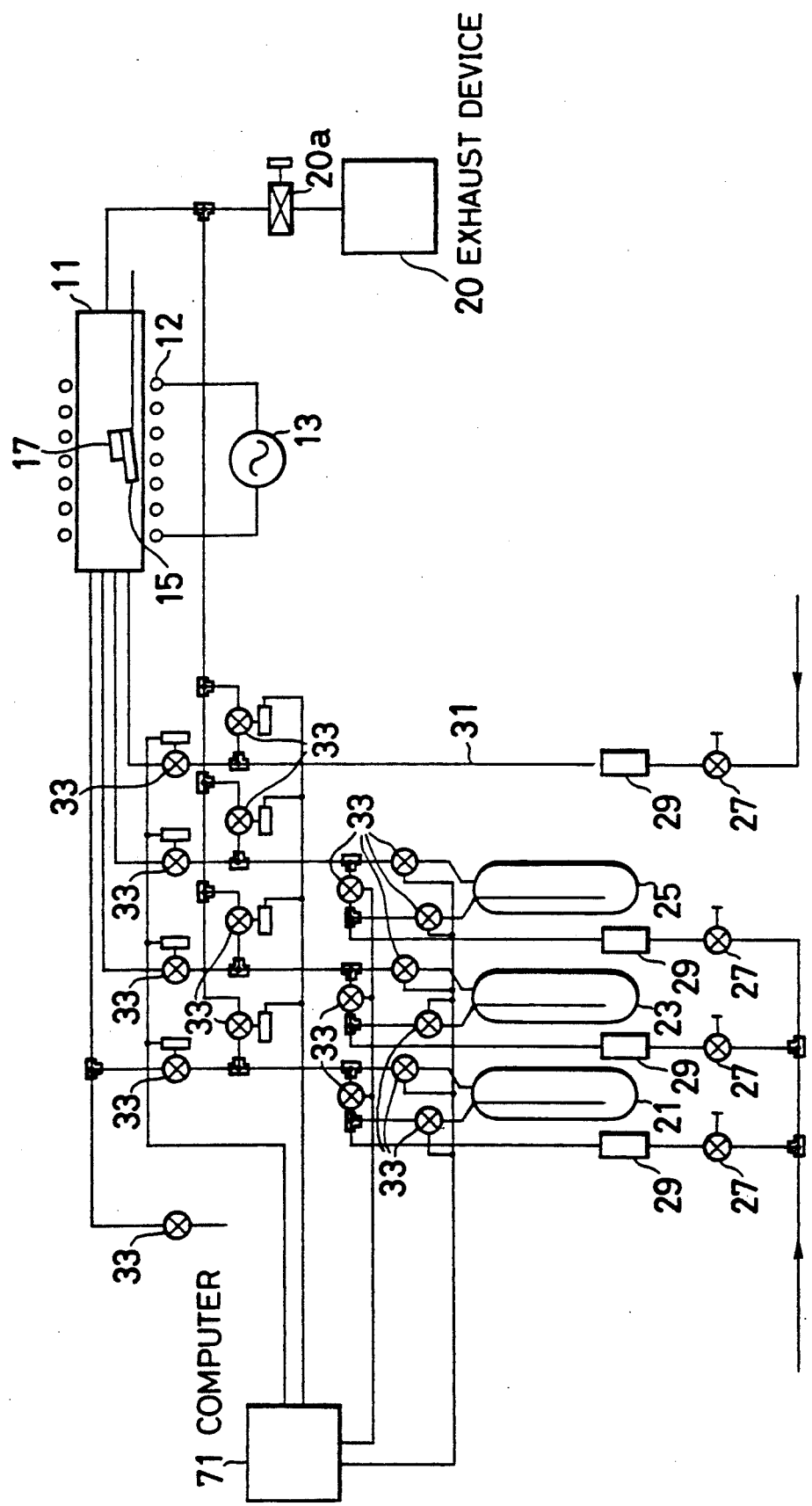
FIG. 7 is a diagram for explaining the seventh embodiment of the process of forming an oxide superconducting film according to the invention.

Embodiment 7 of forming an oxide superconducting film in this invention will now be described with reference to FIG. 7. FIG. 7 is a block diagram of the structure of suitable CVD apparatus for forming the film in this embodiment.

In Embodiment 7, the opening and shutting of several valves 33 in the diagram is automatically controlled by a computer 71. In the example shown the operations performed manually in Embodiment 1 are automated. Apart from the use of computer control, the other details of the method and construction are the same as in Embodiments 1-3, and are therefore omitted.

In this method, the growth of the desired film is controlled automatically by the program input in computer 71, e.g. the order of opening of the valves, the times during which the valves are open or shut, and the number of times of opening or shutting.

Although not shown in FIG. 7, a light source can of course also be provided to excite the starting material gases in the apparatus, and the film is grown while irradiating them with light.

Embodiment 8

Figure 8A:
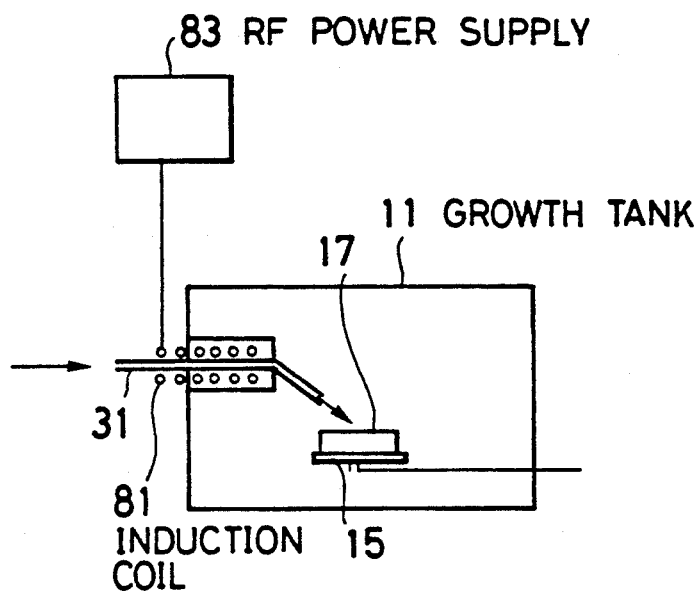
FIG. 8A and FIG. 8B are diagrams for explaining the eighth embodiment of the process of forming an oxide superconducting film according to the invention.
Figure 8B:
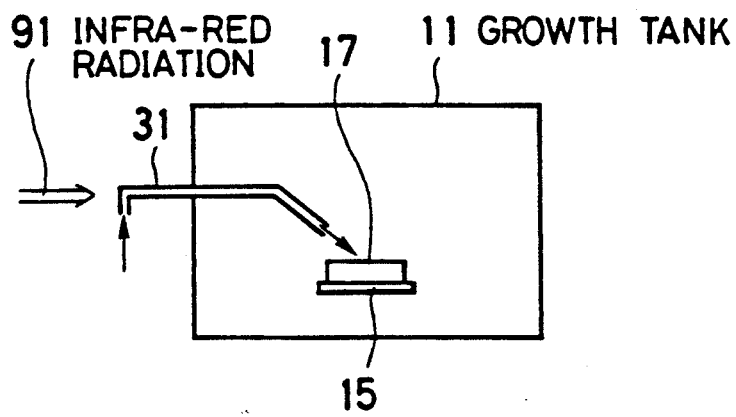

Embodiment 8 of forming an oxide superconducting film in this invention will now be described with reference to FIG. 8A and FIG. 8B. FIG. 8A and FIG. 8B are intended to explain Embodiment 8, and show mainly the growth tank 11 and oxygen gas ducts leading to the tank.

In this embodiment, oxygen gas is ozonized or converted to radicals in order to promote the chemical reaction of CVD, and to growth the film efficiently. Apart from ozonization, the other details of the method and the construction of the apparatus are the same as in Embodiments 1-3, will therefore be omitted.

In FIG. 8A, 31 is an oxygen gas supply duct as already mentioned. A high frequency (RF) heating coil 81 is wound around the outer circumference of duct 31 near growth tank 11. 83 is a high frequency heating coil power supply. In this construction, oxygen is converted to plasma, ozone is generated, and this ozone is supplied to growth tank 11.

In the example shown in FIG. 8B, ultraviolet radiation 91 is allowed to irradiate oxygen supply duct 41 to generate ozone, which is supplied to growth tank 11.

The generation os ozone may be either continuous or intermittent, but should be carried out as convenient depending on the conditions of formation of the film.

The method of this Embodiment 8 is also effective in reducing the temperature of the growth tank.

Embodiment 9

The CVD apparatus used in this embodiment is the same as that used in Embodiment 1.

In this embodiment, the gas sources for the starting materials were Y(DPM)$_3$, Ba(DPM)$_2$ and Cu(DPM)$_2$.

The cylinders 21, 23 and 25 were charged with starting materials Y(DPM)$_3$, Ba(DPM)$_2$ and Cu(DPM)$_2$, respectively, and the temperatures within the cylinders 21, 23 and 25 were maintained at about 134° C., 234° C., and 128° C., to convert the starting materials into gases, and the flowrate of the carrier gas (Ar) was set at 50 cc/min. and the flowrate of the O$_2$ gas was set at 400 cc/min.

Figure 9:
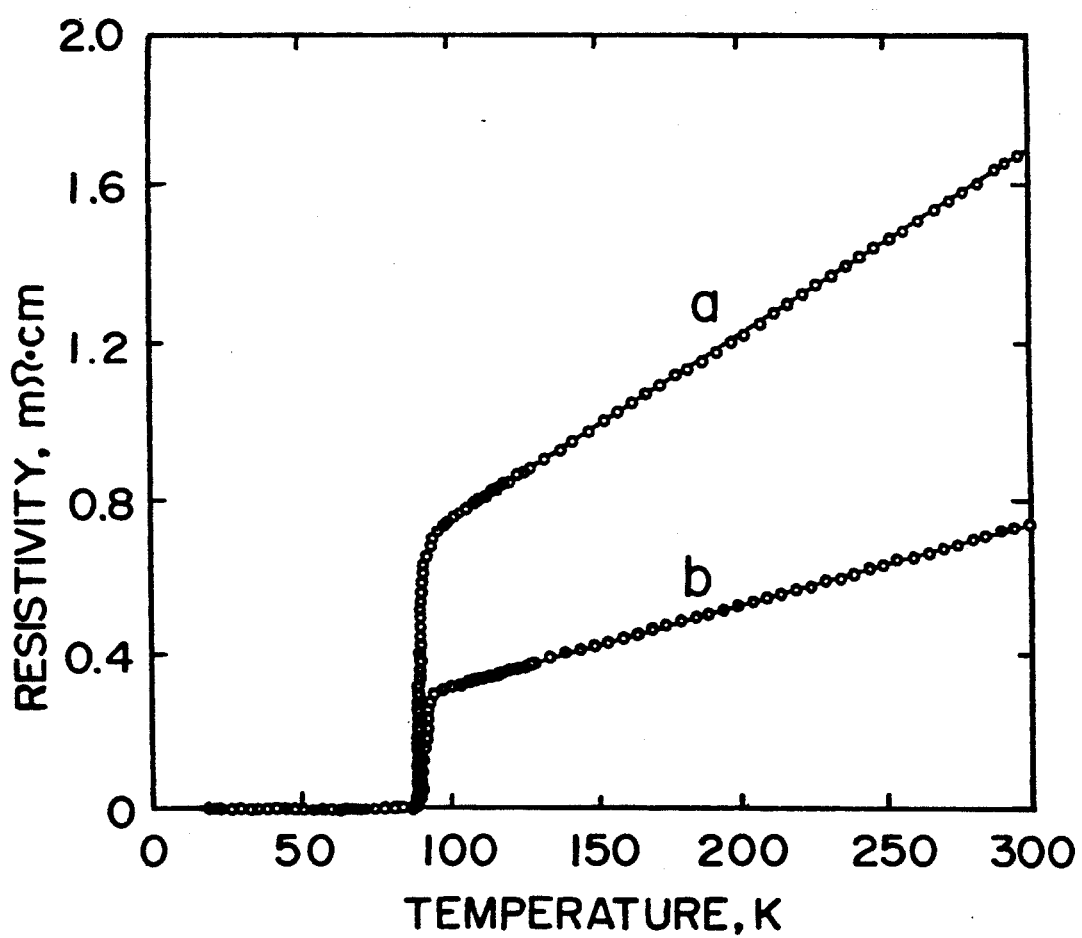
FIG. 9 shows resistance-temperature characteristics of thin films obtained by Embodiments 9 and 10.

As the substrate 17, MgO was used, and the surface on which the superconductor thin film was formed has the (100) orientation. The temperature of the substrate 17, i.e., the temperature used for the growth, was maintained at 800° C., and the gases from the cylinders 21, 23 and 25, and the O$_2$ gas were introduced into the growth tank 11, and the film was grown on the substrate 17 for about 30 minutes. The O$_2$ gas was kept flowing while the temperature was gradually lowered to room temperature. The substrate 17 was then taken out. The thickness of the film formed by this embodiment was 0.5 μm, and the resistance-temperature characteristics is shown by curve (a) in FIG. 9. It is evident from this curve (a) that the resistance of this thin film is decreased with the temperature, and the zero resistance was exhibited at about 91° K.

Embodiment 10

The CVD apparatus used in this embodiment is the same as that used in Embodiment 1.

In this embodiment, the starting materials were the gas sources used in Embodiment 1, i.e., Y(DPM)$_3$, Ba(DPM)$_2$ and Cu(DPM)$_2$ with the addition of the organic solvent tetrahydrofuran (abbreviated as THF) represented by the chemical formula:

Firstly, the cylinders 21, 23 and 25 were charged with starting materials Y(DPM)$_3$·(THF)$_n$, Ba(DPM)$_2$·(THF)$_n$ and Cu(DPM)$_2$·(THF)$_n$ respectively, and their internal temperatures were maintained at about 130° C., 230° C. and 124° C., respectively, to convert the starting materials to gases. The flowrate of carrier gas (Ar) in cylinders 21, 23 and 25 was set at 50 cc/min. and the flowrate of O$_2$ gas was set at 200 cc/min. The symbol "n" is any integer, and need not be any greater than 10.

The gases from cylinders 21, 23 and 25, together with O$_2$ gas, were introduced into growth tank 11, and a superconducting film was grown on the (100) surface of a substrate 17 consisting of MgO at a temperature (substrate temperature) of 800° C. for 30 min. The other growth conditions were the same as those of Embodiment 1.

The O$_2$ gas was kept flowing while the temperature was gradually lowered to room temperature. The substrate 17 was then taken out. The thickness of the film formed by this embodiment was 0.5 μm, and the resistance-temperature characteristics is shown by curve (b) in FIG. 9. It is evident from this curve (b) that the zero resistance was exhibited at about 91° K.

When SrTiO$_3$ with (110) surface or with (100) surface was used as the substrate in place of the MgO and the same conditions as in the Embodiments 9 and 10 were used, the resultant film exhibited zero resistance at about 91° K.

It is also clear that two or more of the methods described in the above embodiments may be used in combination to form the oxide superconducting film more effectively.

In the above embodiments, a film of the type Y-Ba-Cu-O is formed. Good results are however also obtained if Y (yttrium) is replaced by one element M from the list Y, La, Nd, Pm, Sm, Eu, Er, Gd, Tb, Dy, Ho, Tm, Yb, Lu; the starting material gas is M(DPM)$_3$, M(DPM)$_3$·(THF)$_n$ or M(DPM)$_3$·(DPM)$_n$; and the growth conditions are the same as those in the above Embodiments 1-3.

Further, in the above embodiments, O$_3$ gas or N$_2$O gas may be used in place of O$_2$ gas, or a combination of two or more of the gases O$_2$, O$_3$ and N$_2$O may be used.

As is clear from the above description, the method of this invention gives an oxide superconducting film with an extremely flat, smooth surface and good superconducting properties, and there is less damage to the substrate or film formed than with physical methods of formation such as the sputter method. As a result, there is very little damage to, for example, the surface of the insulating layer which constitutes the weak coupling of a Josephson element, and contact surfaces with few defects can thus be obtained.

Further, by choosing the type of starting material gases, and by varying the conditions of supply, order of supply and film growth conditions, it is possible to obtain a film of any desired composition and crystalline structure.

Further, when growing an oxide superconducting film by the CVD method, the film growth speed can be adjusted such that the superconducting thin film is grown one molecular layer at a time. It is thus possible to control the growth of the film such that it corresponds to, for example, the coherence length of a superconductor.

I claim:

1. A process for forming a superconducting film on a substrate using chemical vapor deposition wherein the superconducting film exhibits a zero resistance at a temperature of at least 80° K., said process comprising the steps of:
   (a) heating said substrate upon which said superconducting film is to be formed;
   (b) providing the following source materials:
      (1) one of the compounds Ba(DPM)$_2$·(THF)$_\eta$ or Ba(DPM)$_2$·(DMF)$_\eta$,
      (2) one of the compounds Cu(DPM)$_2$·(THF)$_\eta$ or Cu(DPM)$_2$·(DMF)$_\eta$, and
      (3) one of the compounds M(DPM)$_3$·(THF)$_\eta$ or M(DPM)$_3$·(DMF)$_\eta$,
   where DPM is 2, 2, 6, 6-tetramethyl-3,5-heptaneodianate represented by the chemical formula

where THF is tetrahydrofuran represented by the chemical formula:

where DMF is dimethylformamide represented by the chemical formula CHON(CH$_3$)$_2$
   where M is an element chosen from the list:
   Y, La, Nd, Pm, Sm, Eu, Er, Gd, Tb, Dy, Ho, Tm, Yb or Lu, and
   where n is any integer;
   (c) gasifying said source materials to form first gases;
   (d) introducing said first gases into a growth tank; and
   (e) simultaneously introducing at least one of the following second gases O$_2$, O$_3$, or N$_2$O to said tank whereby an oxide superconducting film is formed on said substrate located in said growth tank.

2. A process according to claim 1 further including radiating said growth tank with electromagnetic radiation.

3. A process according to claim 1 further including ozonizing said second gas by means of RF heating coil or UV lamp.

4. A process according to claim 1, wherein the growth of the superconductor film in said CVD method is carried out under conditions to permit formation of one molecular layer at a time.

5. The process of claim 1 wherein said superconduct film exhibits a zero resistance between 80° K. and 91° K.

* * * * *